United States Patent
Liu

(10) Patent No.: US 10,872,985 B2
(45) Date of Patent: Dec. 22, 2020

(54) ZERO COST NVM CELL USING HIGH VOLTAGE DEVICES IN ANALOG PROCESS

(71) Applicant: David Liu, Fremont, CA (US)

(72) Inventor: David Liu, Fremont, CA (US)

(73) Assignee: JONKER LLC, Zephyr Cove, NV (US)

( * ) Notice: Subject to any disclaimer, the term of this patent is extended or adjusted under 35 U.S.C. 154(b) by 532 days.

(21) Appl. No.: 14/996,653

(22) Filed: Jan. 15, 2016

(65) Prior Publication Data

US 2016/0172505 A1 Jun. 16, 2016

Related U.S. Application Data

(62) Division of application No. 13/468,417, filed on May 10, 2012, now Pat. No. 9,305,931.

(60) Provisional application No. 61/484,528, filed on May 10, 2011.

(51) Int. Cl.

| H01L 29/788 | (2006.01) |
|---|---|
| H01L 29/78 | (2006.01) |
| H01L 29/423 | (2006.01) |
| H01L 29/10 | (2006.01) |
| H01L 29/66 | (2006.01) |
| H01L 27/11558 | (2017.01) |
| H01L 27/11517 | (2017.01) |
| H01L 27/11519 | (2017.01) |

(Continued)

(52) U.S. Cl.
CPC .... *H01L 29/7885* (2013.01); *H01L 27/11517* (2013.01); *H01L 27/11519* (2013.01); *H01L 27/11521* (2013.01); *H01L 27/11541* (2013.01); *H01L 27/11558* (2013.01); *H01L 29/1095* (2013.01); *H01L 29/42324* (2013.01); *H01L 29/66825* (2013.01); *H01L 29/7816* (2013.01); *H01L 29/7883* (2013.01)

(58) Field of Classification Search
CPC ......... H01L 27/11517; H01L 27/11519; H01L 27/11521; H01L 29/7885; H01L 29/7881; H01L 29/7884; H01L 29/7817; H01L 29/7883

See application file for complete search history.

(56) References Cited

U.S. PATENT DOCUMENTS

| 4,412,311 A | 10/1983 | Miccoli et al. |
|---|---|---|
| 4,532,611 A | 7/1985 | Countryman, Jr. |
| 4,870,304 A | 9/1989 | Bloker et al. |

(Continued)

OTHER PUBLICATIONS

Clendenin, Mike; "eMemory extends OTP to 0.15 .mu.m high voltage process," EE Times Asia, Jul. 26, 2006, 1 page.

(Continued)

*Primary Examiner* — Mohammed Shamsuzzaman
*Assistant Examiner* — Aaron J Gray

(57) ABSTRACT

A non-volatile memory cell and array structure is disclosed situated within a high voltage region of an integrated circuit. The cell utilizes capacitive coupling based on an overlap between a gate and a drift region to impart a programming voltage. Programming is effectuated using a drain extension which can act to inject hot electrons. The cell can be operated as a one-time programmable (OTP) or multiple-time programmable (MTP) device. The fabrication of the cell relies on processing steps associated with high voltage devices, thus avoiding the need for additional masks, manufacturing steps, etc.

20 Claims, 3 Drawing Sheets

(51) Int. Cl.
*H01L 27/11521* (2017.01)
*H01L 27/11541* (2017.01)

(56) References Cited

U.S. PATENT DOCUMENTS

| | | | |
|---|---|---|---|
| 5,021,999 | A | 6/1991 | Kohda et al. |
| 5,283,759 | A | 2/1994 | Smith |
| 5,482,880 | A | 1/1996 | Kaya et al. |
| 5,548,146 | A | 8/1996 | Kuroda et al. |
| 5,586,073 | A | 12/1996 | Hiura et al. |
| 5,712,816 | A | 1/1998 | Cappelletti et al. |
| 5,914,895 | A | 6/1999 | Jenne |
| 6,441,443 | B1 | 8/2002 | Hsu et al. |
| 6,489,202 | B1 | 12/2002 | Hsu et al. |
| 6,501,685 | B2 | 12/2002 | Hsu et al. |
| 6,631,087 | B2 | 10/2003 | Pede et al. |
| 6,678,190 | B2 | 1/2004 | Yang et al. |
| 6,920,067 | B2 | 7/2005 | Hsu et al. |
| 7,242,621 | B2 | 7/2007 | Mirabel et al. |
| 7,920,426 | B2* | 4/2011 | Liu .................. H01L 27/11558 365/185.18 |
| 2005/0023656 | A1 | 2/2005 | Leedy |
| 2006/0057798 | A1 | 3/2006 | Komori et al. |
| 2006/0067124 | A1 | 3/2006 | Lee et al. |
| 2007/0047302 | A1 | 3/2007 | Lee et al. |
| 2007/0194371 | A1 | 8/2007 | Benjamin |
| 2007/0247902 | A1 | 10/2007 | Chen et al. |
| 2007/0255893 | A1 | 11/2007 | Takeuchi |
| 2008/0061347 | A1* | 3/2008 | Mallikararjunaswamy ................. H01L 27/115 257/314 |
| 2008/0186772 | A1* | 8/2008 | Horch ............... H01L 27/11519 365/185.18 |
| 2008/0225593 | A1 | 9/2008 | Mitros et al. |
| 2009/0114972 | A1* | 5/2009 | Liu .................. H01L 29/66825 257/315 |
| 2009/0122605 | A1* | 5/2009 | Liu ...................... H01L 27/112 365/185.03 |
| 2009/0212342 | A1* | 8/2009 | Roizin ............. H01L 29/40114 257/316 |

OTHER PUBLICATIONS

Clendenin, Mike; "Flash maker eMemory gaining foundry converts," EE Times Asia, Nov. 6, 2003, 2 pages.
Datasheet, "Numonyx Embedded Flash Memory(J3vD)," Dec. 2007, 66 pages.
International Search Report and Written Opinion for PCT/US12/37349, dated Aug. 24, 2012, 22 pages.
International Search Report and Written Opinion for PCT/US2008/82294, dated Dec. 19, 2008, 8 pages.
International Search Report and Written Opinion for PCT/US2008/83697, dated Jan. 9, 2009, 21 pages.
UMC, "Embedded Memory SoC Process Technology," undated, 8 pages.

* cited by examiner

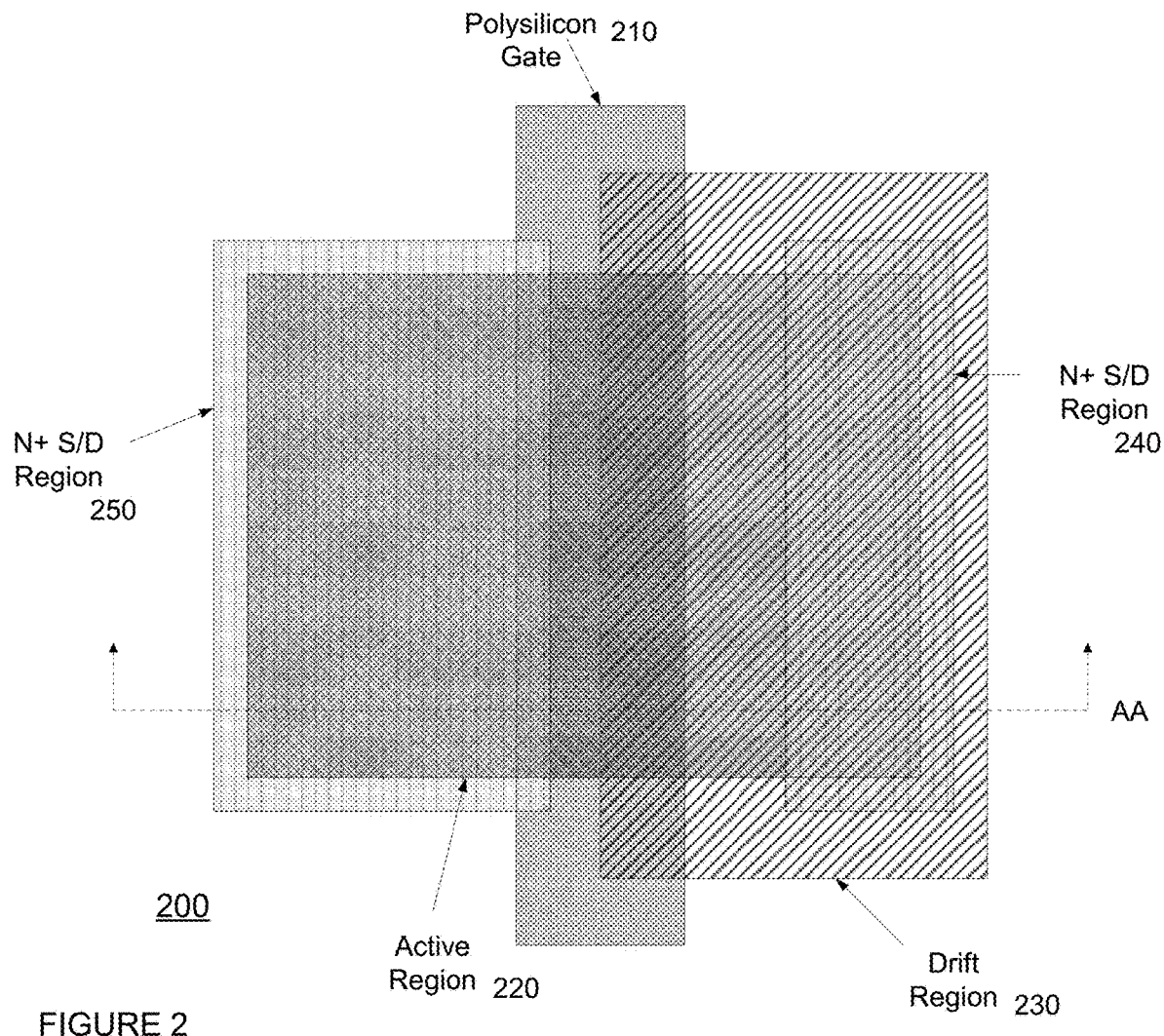
FIGURE 2
PRIOR ART
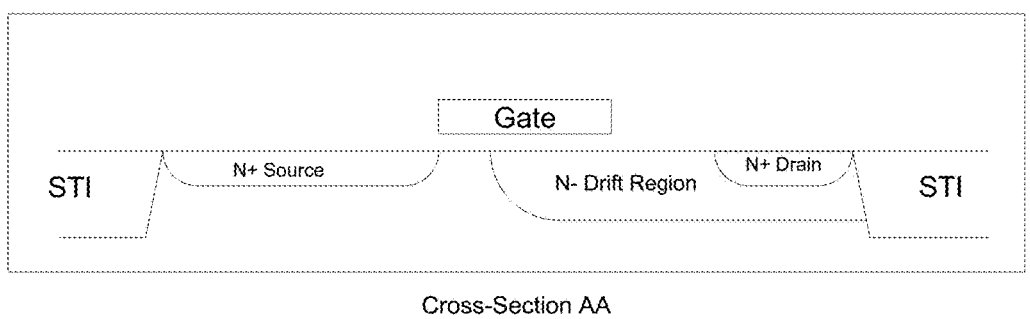
Cross-Section AA

PRIOR ART

ZERO COST NVM CELL USING HIGH VOLTAGE DEVICES IN ANALOG PROCESS

RELATED APPLICATIONS

The present application is a divisional of U.S. patent application Ser. No. 13/468,417, filed May 10, 2012, which claims the benefit under 35 U.S.C. 119(e) of the priority date of Provisional Application Ser. No. 61/484,528 filed May 10, 2011. Both of those applications are hereby incorporated by reference in their entireties.

FIELD OF THE INVENTION

The present disclosure pertains to semiconductor devices, particularly non-volatile memories which can be implemented in analog, high voltage device processes.

BACKGROUND

Reference is made to U.S. Pat. Nos. 7,782,668 and 7,787,295 and U.S. patent application Ser. Nos. 12/264,029, 12/264,060, 12/264,076, 12/271,647, 12/271,666 and 12/271,680 all of which are hereby incorporated by reference.

The '668 patent discloses a new type of single-poly non-volatile memory device structure that can be operated either as an OTP (one time programmable) or as an MTP (multiple time programmable) memory cell. The device is programmed using hot electron injection. It also has a structure that is fully compatible with advanced CMOS logic process, and would require, at the worst case, very minimal additional steps to implement. Other unique aspects of the device are described in the '668 patent as well.

Recent developments have focused on incorporating Non-volatile memory cell into pure CMOS logic or digital process, as well as into analog or high voltage process, all without incurring additional process complexities. The advantages of this approach can be implemented in logic integrated circuits, as well as analog integrated circuits and Power Management IC (PMIC). For example for PMICs, the beneficial applications of incorporating NVM cell into integrated circuits include reference trimming and calibration code storage to name a few.

One traditional approach to implement a low cost non-volatile memory cell has been to use a basic logic or low voltage (LV) transistor structure and associated process steps. An example of this is shown in U.S. Pat. No. 7,852,672 incorporated by reference herein. As such, the nonvolatile memory structures will feature oxide thicknesses that are predetermined by what is already available in structures used in the LV/logic transistors. Typically the thickest oxide that is available for use within an embedded NVM cell therefore is from the oxide of the I/O transistors in the logic process. Such oxide has a maximum thickness that is typically in the range of 65 to 70 Angstroms for 3.3V I/O voltage level, and is optimized for a performance of logic gates. While this oxide thickness is thin enough to allow efficient channel hot electron programming and channel hot hole erasing, and is suitable for a majority of embedded storage functions, it would be desirable in some applications for the oxide thickness to be larger so as to meet certain types of applications which may require more stringent data retention and/or extended endurance cycling requirements. Thus, Applicant has determined it would be desirable to be able to implement a NVM cell in the analog or PMIC process that can have a more robust data retention characteristics through a thicker gate oxide.

SUMMARY OF INVENTION

An object of the present invention is to extend the use of non-volatile memories into areas of semiconductor device using an analog or PMIC process so that it can integrated into a high voltage portion of such device.

One aspect of the invention therefore concerns a programmable non-volatile device situated on a substrate comprising a floating gate which is comprised of a material that is also used as a gate for a high voltage transistor device also situated on the substrate. A source region is coupled to a first terminal; and a drain region is coupled to a second terminal. A drift region coupled to the drain region preferably overlaps a sufficient portion of said gate such that a programming voltage for the device applied to the first terminal of the drain region and second terminal of the source region can be imparted to the floating gate through areal capacitive coupling.

In preferred embodiments the device is programmed using hot channel electrons. The drift region is preferably configured with a notched portion to permit an extension of the drain region against the floating gate, which enhances hot electron injection. The capacitive coupling can also be controlled as needed by areal overlap between the drain region and gate. For most applications the gate oxide is at least 100 angstroms but will vary of course depending on the process technology available and desired performance.

All structures of the device, including the floating gate, source region, drain region and drift region are constructed preferably during manufacturing steps used to make high voltage devices of an integrated circuit. In this manner embodiments of the device can be made using only structural components otherwise associated with HV LDMOS devices.

Embodiments of the device can be configured as a one-time programmable device, or even as a multiple time programmable device. In some integrated circuits it may be desirable to have a separate array of memory cells having thinner oxides (i.e., made by a logic process) in addition to the current cell array.

Another aspect of the invention concerns a lateral diffused metal oxide semiconductor (LDMOS) structure comprising: a floating gate; a source region coupled to a first terminal; and a drain region coupled to a second terminal; and a drift region coupled to the drain region; the drift region preferably having a first portion which is overlapping at least a first areal portion of the gate and a second notched portion; the LDMOS is thus adapted such that a voltage applied to the first terminal of the drain region and second terminal of the source region can be imparted to the gate through areal capacitive coupling so that the high voltage LDMOS structure can function as a memory cell.

In some embodiments the drain region overlaps a second portion of the gate. The drain region preferably extends through the second notched portion of said drift region and is configured to enhance hot electron injection into an edge region of the gate.

A further aspect concerns a lateral drift N-type metal oxide semiconductor (LDMOS) structure comprising a gate having no contacts to a voltage supply; a source region coupled to a first terminal; a drain region coupled to a second terminal; a drift region coupled to the drain region, the drift region having a first portion which is overlapping at least a first areal portion of said gate and a second notched portion. In this manner the LDMOS is adapted such that a voltage applied to the first terminal of the drain region and second terminal of the source region can be imparted to the gate through areal capacitive coupling, and the LDMOS structure can function as a memory cell.

Another aspect relates to a programmable non-volatile device situated in a high voltage circuit portion of a substrate comprising: a floating gate comprised of a material that is also used as a gate for a high voltage transistor device also situated in the high voltage circuit portion of the substrate; a source region coupled to a first terminal; a drain region coupled to a second terminal, which has an extension which abuts at least a first edge of the floating gate; and a drift region coupled to the drain region which overlaps a sufficient portion of said gate such that a programming voltage for the device applied to the first terminal of the drain region and second terminal of the source region can be imparted to the floating gate through areal capacitive coupling. The drain extension preferably extends within a notched portion of said drift region and can inject hot electrons along said first edge of said floating gate in response to the programming voltage.

Another aspect of the invention concerns both methods of operating and making the aforementioned inventive cells and arrays.

DESCRIPTION OF THE DRAWINGS

FIG. 2 depicts a prior art high voltage I/O driver made using a high voltage or analog process in an integrated circuit;

DETAILED DESCRIPTION

Figure 3A:
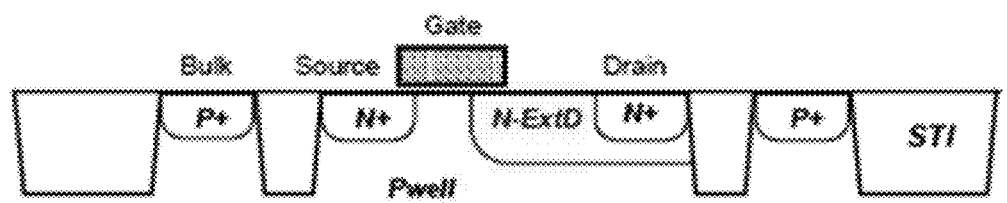
FIG. 3A depicts a prior art high voltage Extended Drain NMOS device.
Figure 3B:
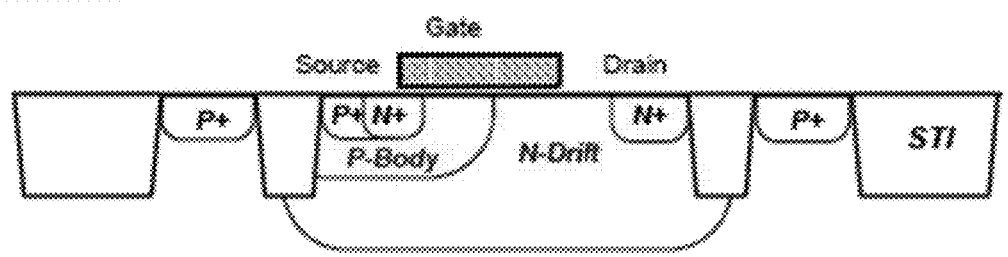
FIG. 3B depicts a prior art high voltage Lateral NDMOS device.

As alluded to above, one option that has hitherto gone unexplored is the possibility of using a generic high voltage process/structure as a starting point for an NVM embedded cell. A high voltage fabrication process is typically an optimized process/module for making insulated gate FETs (IGFETs) within a standard CMOS process flow for an integrated circuit. Examples of prior art high voltage devices (Extended Drain NMOS and Lateral NDMOS) are shown in FIGS. 3A and 3B. The key difference between these two types of devices is that in one case (FIG. 3B) the out-diffusion of the drift region determines the channel length of the enhancement region; in the other case (FIG. 3A) it is the pwell diffusion that determines the enhancement channel length. Persons skilled in the art will appreciate that other types of high voltage devices known in the art can be modified in accordance with the present teachings.

A typical prior art high voltage I/O driver IGFET 200 (also shown generally in FIG. 3B) made with a high voltage process is shown in FIG. 2. As seen here, a polysilicon gate 210 is situated over an active region 220 between a pair of N+-type drain/source regions 240 and 250 respectively. An n-type (N−) "drift" region 230 is used to sustain the high drain voltage in what is referred to as a voltage blocking mode. This is achieved through the lightly doped drift region spreading out the voltage in a gradual fashion, very much in the same principle as that of an LDD structure used in reducing the maximum drain edge electric field in a CMOS transistor. Since the blocking voltage capability is the integration of the electric field spreading out over the drift region, a typical high voltage IGFET will have a long drift region underneath the gate. One consequence of this doping gradient and the drift region is that the electric field is attenuated and the generation of hot carriers is significantly reduced. A cross sectional view of the relationship of the N+ drain, n− drift region and gate along line AA is shown in the bottom of FIG. 2. Again it will be understood that this drawing is not drawn to scale, and is intended merely as an exemplary illustration to assist in understanding the present invention.

In such high voltage applications, the most widely utilized blocking voltage capabilities for IGFET 200 are in the range of 16V to 40V. This is a function of the particular device, however, and can be varied as needed depending on the application. Furthermore, unlike the thinner oxides used in logic circuits/processes, the oxide (not shown separately, but located under the Gate) thicknesses for these high voltage transistors are typically around 100 to 125 angstroms for the aforementioned 16 to 40V blocking capability. Again this is expected to change, and will vary according to the particular application. This IGFET gate oxide thickness range is thicker than a standard logic gate process, and thus can offer additional channel hot electron programming efficiency and data retention characteristics. Since for any particular process generation the oxide thickness of such HV components will always be thicker than for LV logic gates, and the thickness of such oxides is a limiting factor in the potential for implementing NVM cells, the present invention offers an opportunity to extend the lifespan of embedded NVM into subsequent generations of integrated circuits which include such types of high voltage structures. Thus as LV logic gates get thinner, it may be possible in some devices that only NVM in the HV areas will be possible.

As noted earlier, a recent novel invention by the inventor in the zero cost embedded NVM cell structure (as shown in U.S. Pat. No. 7,852,762 referenced above) teaches the use of a high gate-to-drain coupling ratio to facilitate channel hot electron programming of an NMOS type single poly NVM cell. The high gate-to-drain coupling ratio is achieved by having a relatively large overlap region between an extended drain region and a floating gate of memory cell. This areal gate to drain overlap allows a significant portion of the applied drain voltage during programming operation to be coupled to the floating gate, and thus allowing the floating gate to be favorable in receiving the injected hot electrons. The aforementioned novel invention is applied to LV/logic transistors to implement NMOS OTP/MTP memory cell.

The preferred embodiment of the present invention uses high voltage structures to effectuate a similar capacitively coupled NMOS OTP/MTP memory cell 100 (FIG. 1) into a high voltage regime. Note that in FIG. 1, commonly referenced identification numbers are intended to correspond to similarly labeled items in FIG. 2 unless otherwise indicated.

Figure 1:
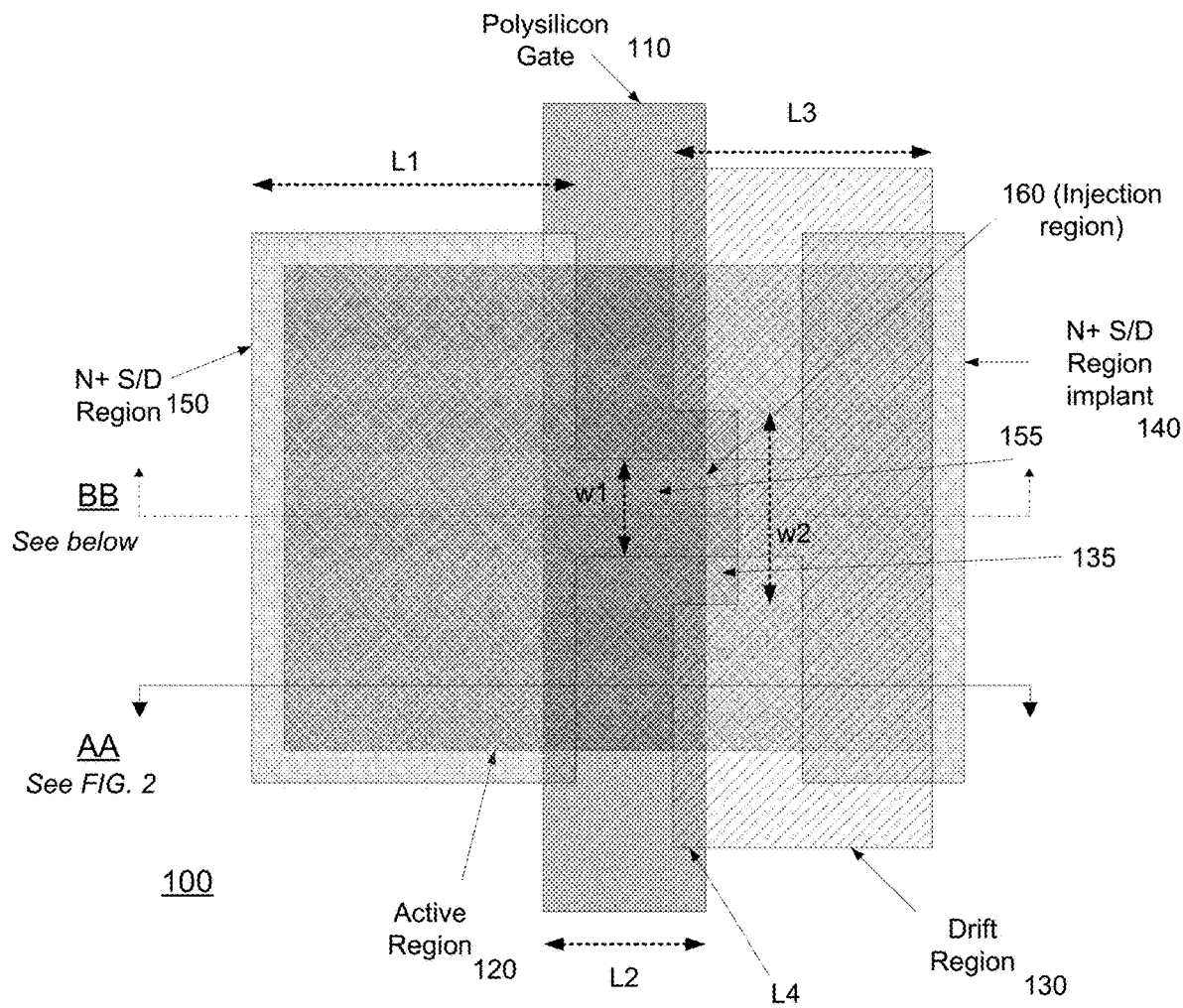
FIG. 1 depicts a preferred embodiment of a memory device implemented in accordance with the present teachings.
Figure 1:
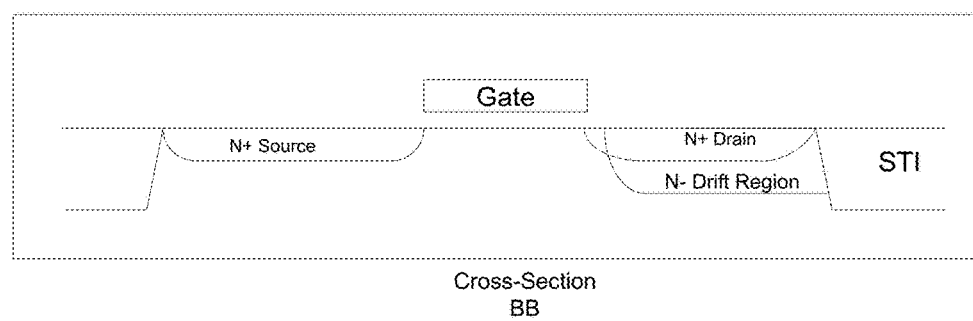

As noted above, in high voltage process, many of the commonly used high voltage NMOS transistors feature an N− type drift region 230 (FIG. 2) that connects to the drain but can be extended in some cases (including in embodiments of the present invention) to overlap a significant portion of the gate region 210. As seen in FIG. 1, Applicant submits that this overlap of the drift region 130 under gate 110 can be used—in conjunction with other modifications described herein—to serve as a gate coupling capacitor to achieve a high drain to gate coupling ratio and thus implement an NVM cell. While the preferred embodiment shows the coupling achieved by way of the n− drift region/gate coupling, it will be understood that in other high voltage IGFET implementations that other regions could be used to achieve a similar coupling effect.

Thus from this perspective, an HV IFGET 100 already incorporates a useful structure that can be modified and exploited in some instances to form a high gate/drain areal coupling to achieve favorable channel hot electron injection condition. In other words, as seen in FIG. 1, the structural cross section across line AA is the same as shown for FIG. 2. However, a conventional n− drift region 230—in its typical, unaltered form—is not sufficient to facilitate CHE programming, due to the inherently lightly doped nature of the drift region. This light doped drift region is intentionally configured in the prior art to serve to spread out the electric field induced by an imposed drain voltage. This makes it difficult (or impossible) to achieve a high peak electric field at the edge of the gate-drain overlap region to achieve significant hot carrier injection as would be required to achieve any programming. Accordingly, due to its inherent limitations, the typical prior art HV IGFET structure in fact expressly teaches away from CHE injection and would not be considered by one skilled in the art as something suitable for an NVM cell.

The unique approach taken in preferred embodiments of the present invention takes a typical power device structure (as a preferred example: a laterally diffused metal oxide semiconductor (LDMOS gate) and modifies it through a new geometry and new structure to make it suitable as an NVM cell 100 as seen in FIG. 1. This modification can be done with a few basic masking changes that create a different layout for the IGFET and allow for configuring and optimizing electric field conditions suitable for programming as a memory cell. This layout improvement preferably implements a Nonvolatile memory cell with not only enhanced drain coupling, but also a high peak electric field under a gate-drain overlap region to facilitate channel hot electron programming of the device, using existing high voltage process steps.

This implementation of an NVM cell has the advantage not only of zero or low additional process complexity, but also potentially enhanced data retention characteristics, since the oxide thickness is at least 100 angstroms. Moreover, as noted above, the inherent oxide disparity between output FETs and logic FETs ensures that some form of embedded memories can continue to be implemented in digital and analog architectures in succeeding generations of integrated circuits which would otherwise be unsuitable for such flash-based cells. It is understood of course that in some applications an integrated circuit device may in fact employ both types of memory cells (i.e., one type through a logic process and another type through a high voltage analog process) depending on the nature and requirements of the application in question.

As seen in FIG. 1 therefore, a NVM cell 100 preferably includes structures and features common to HV devices in an HV region of an integrated circuit, but some of which are modified to implement a memory device, as well as new structures. Note that the polysilicon gate 110 can be part of a polysilicon layer used for logic gates (or logic based NVM cells) as well. The main difference for this device is that the underlying insulating first oxide layer for the HV devices are made with a thickness and/or material that differs from that used in a second oxide layer for logic devices within the same IC (which may be and are typically located in a separate area of the IC).

Thus, a polysilicon gate 110 overlaps an active region 120, and is situated between a first source/drain region 140 and a second source drain/region 150. Analogous to the aforementioned prior art capacitively coupled cell, after the gate is formed, a portion of an extended drain implant region 155 is preferably created in the source/drain implant mask so that it extends (at least to a small extent) under the poly gate 120. This extension of the source/drain regions in the mask is designated to have a nominal width W1 and preferably a length sufficient to bridge the nominal source/drain regions 140, 150 associated with the conventional high voltage devices in the integrated circuit. Note that for illustrative purposes what is shown in FIG. 1 is the S/D implant mask, and not the final layout of the S/D regions 140, 150.

This alteration of the S/D implant mask ensures that regardless of an implant alignment, at least some overlap will occur between gate 110 and drain extension 155 in an injection region 160 for program/erase operations. This injection region can be configured through any number of known methods to achieve a desired programming efficiency.

The voltage coupling in this embodiment is preferably achieved through the overlap of a portion (L4) of drift region 130 and poly gate 110 (L2), rather than simply through a conventional source/drain as described in Applicants' prior applications. In general the coupling ratio can be designed as needed based approximately on the L4/L2 ratio.

In a preferred embodiment a rectangular notch (or some other suitable cutout such as U or V shape) 135 is formed in drift region 135 as well. This allows a higher S/D implant for extension 155 to come forward and abut against gate 110 edge and enhance channel hot electron injection preferably along an edge portion/region 160. Note again that the implant mask shown in FIG. 1 for drain extension 155 is blocked by the poly gate 110 so that the drain extension does not actually extend under the channel, but is nonetheless guaranteed to border along an edge of the gate with a nominal width W1.

The geometry of the drift region is thus optimized for cell programming since the un-notched portion gives areal gate-drain overlap, while the notched portion 135 gives a high electric field in region 160 suitable for programming and erase due to the drain extension 155. This modification, too, improves the performance of the cell. Again, in the embodiment presented a drift region is used, but it will be understood that other comparable structures could be used.

It will be apparent that gate 110 can also be adjusted in size/orientation to achieve any desired coupling configuration. In addition the size, shape and orientation of notch 135 (of which there may be more than one) can be altered through routine experimentation to divine an acceptable design for any particular requirement.

As seen in FIG. 1 L3 is a design parameter that can also be varied as needed. The amount of blocking voltage imposed on this region in high voltage applications is typically a design parameter, and thus can be used for adjusting the amount of drain coupling. This implant is typically not self-aligned to the gate, so there is some mis-alignment tolerance in high voltage transistors. Nonetheless, based on a desired coupling ratio one can do a routine calculation and adjust the vertical length of the poly (width of the device) to obtain proper coupling ratio.

The size of W1 with respect to the total length of drift region (in the vertical direction) affects the coupling ratio as well. W2 can be set so that the lateral diffusion of the drift region will not swallow up the highly doped drain region to nullify the effect of high peak electric field.

Again a cross section of the device is shown in FIGS. 2 and 1, along lines AA and BB respectively. FIG. 2 shows the overlap of drift region 230 (130 in FIG. 1) underneath gate 210 (110 in FIG. 1) along lines AA. FIG. 1 shows the injection region 160 formed by the overlap of gate 110 and the extension of the drain region 155 along line BB. Again, as noted above, the implant mask for the source/drain regions is configured to have a dog-bone (or T-shaped) like extension, but it does not appear in the final structure under the gate due to the blocking action of the gate.

It should be understood that for some embodiments of cell 100 the gate 110 can be shaped with an additional extension to overlap with region 140 as is shown for example in U.S. Pat. No. 7,852,762 patent referenced above. In addition, variable coupling can be achieved in embodiments of the present invention with selective gate/drift region overlapping in a manner similar to that shown for example in my prior patents, including U.S. Pat. No. 7,787,295. As seen herein, the preferred embodiment is a two terminal device, in that programming and biasing does not require a control gate, or any other direct control of the floating gate. It will be understood of course that three terminal variations may be useful and desirable for some applications.

The invention lends itself to different variants that may be useful in different applications. For example, if cell 100 is manufactured with a standard high voltage I/O gate oxide as used in the other high voltage components, then it can be easily electrically erased to effectuate a multi-time programmable (MTP) cell. In other instances where extended data retention is desired, or where the gate oxide is derived from a 5-V type of oxide for higher breakdown voltage capability, a thick gate oxide (i.e., something more than 125 angstroms) may not lend itself easily to erase via hot hole injection. Instead a higher voltage may be needed in such case to facilitate the erase operation as illustrated above.

Thus, as seen in cell 100 in FIG. 2 (cross section AA) the N-drift region 130 out-runs the N+ diffusion 140 by a significant margin, which latter region is also offset at this point from the edge of gate 110. A notch 135 is preferably made in the N-drift region resulting in a stubby C shape as shown in the figures. Here the N-drift region 130 sets up a high coupling ratio intrinsically even with the same doping/profile composition as that of other conventional high voltage devices, where it is used for spreading out the lateral junction electric field to achieve a high breakdown voltage.

In making the cell, the conventional HV steps can be used such as would be employed to make the HV devices shown in FIGS. 3A, 3B and FIG. 2, along with manufacturing steps unique to the NVM cells. The main difference is that to effectuate a non-volatile memory cell, the N-drift region mask and source/drain mask are altered so that during the steps of making the HV devices, the inventive NVM cell is also formed. Thus a portion 155 of the N+ drain junction is self aligned to gate 110 and unlike the prior art is exposed outside of N-drift region 130, in order to generate an electric field (un-mitigated or un-diluted by the n-drift region) sufficiently large to enable channel hot electron injection in region 160. That is shown in cross-section BB. It will be understood that the figures are not intended to be drawn precisely to scale, and that other geometric shapes, sizes and arrangements can be used to effectuate the goals of the invention. In the end the preferred cell can be seen to use basic components of an HV LDMOS device (gate, gate oxide, source, drain, drift region) to implement a memory function.

A table showing the basic fabrication steps is provided below:

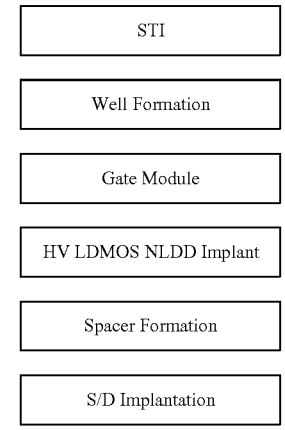

After shallow trench isolation (STI) and well formation for active regions 120, the gates 120 are formed. An HV LDMOS NLDD Implant is then performed with a customized HV cell drift region mask 130 to create a preferably C-shaped drift region as seen in FIG. 1. Thermal cycle may also be used to drive or move the implanted impurity more laterally underneath that gate to achieve a desired coupling effect. This lateral diffusion can be controlled therefore and used for a coupling function for the cell as discussed above.

As also noted earlier this drift region mask has a cutout portion 135 to accommodate an injection structure for the cell. After spacers (not shown) are formed, a customized source/drain cell implant mask is used to create regions 140, 150 and injection region 160.

It is also noted that in some process implementations, the LDMOS NLDD implant, or the drift region implant, can be done prior to the gate module formation. In such implementation, the portion of the drift region under the gate can be subject to mis-alignment. That is the reason the implementation of the structure in Prior Art 3B.

A typical operating table for the device is shown below:

| Bias Condition for Operation as an OTP | | | |
|---|---|---|---|
| OPERATION | Drain | Source | Substrate |
| Program | 5.5 V-6.5 V | 0 V | 0 V |
| Read | 1.0 V | 0 V | 0 V |

| Bias Condition for Operation as an MTP | | | |
|---|---|---|---|
| OPERATION | Drain | Source | Substrate |
| Program | 5.5 V-6.5 V | 0 V | 0 V |
| Read | 1.0 V | 0 V | 0 V |
| Erase | Float | 6.5 V | 0 V |

It will be understood that these are only typical values, and it is expected that actual final operating values will be a function of final feature sizes, desired operating performance, etc., and can be gleaned through routine testing and optimization. Again it should be noted that while the preferred embodiment of the invention is discussed and illustrated with a high voltage device commonly known as lateral Extended drain NMOS device, other types of lateral high voltage device such as Lateral Double-Diffused NMOS device, illustrated in FIG. 3B, can also be modified into an NVM cell with similar notch in the layout to facilitate both high peak field for programming and high gate-drain coupling ratio for the floating gate. In general, the same principle of this invention of using a modified drift region layout for creating a high peak field (in the preferred approach using a notch or other gap), while utilizing the extended drift region for high drain to gate coupling ratio can be applied to many types of NMOS lateral high voltage devices.

What is claimed is:

1. A method of forming a programmable non-volatile memory device in a high voltage circuit portion of a substrate comprising:
   forming a floating gate on a surface of the high voltage circuit portion of a substrate;
   forming a source region in the high voltage circuit portion of a substrate;
   forming a drain region in the high voltage circuit portion of a substrate;
   forming a drift region with a first portion overlapping part of said drain region and a second portion overlapping part of said floating gate in a direction perpendicular to the substrate, the drift region comprising a notch extending into the drift region in a direction away from the source region;
   wherein the drain region has an extension protruding from the drain region into the notch and overlapping a first edge of the floating gate in a direction perpendicular to the substrate, an electron infection region is formed by said drain extension and said first edge of said floating gate, and the notched drift region overlaps a sufficient portion of the floating gate such that a programming voltage for the device can be imparted to said floating gate through areal capacitive coupling.

2. The method of claim 1, wherein completing said programmable nonvolatile memory device only requires manufacturing steps also used to make high voltage devices in the high voltage circuit portion of the substrate.

3. A method of forming a programmable non-volatile memory device in a high voltage circuit portion of a substrate comprising;
   forming a floating gate on a surface of the high voltage circuit portion of a substrate;
   forming a source for the device in the high voltage circuit portion of a substrate;
   forming a drain for the device in the high voltage circuit portion of a substrate;
   forming a drift region also having said first impurity type with a first portion overlapping part of said drain and a second portion overlapping part of said floating gate in a direction perpendicular to the substrate, the drift region comprising a notch extending into the drift region in a direction away from the source region;
   wherein the drain region has an extension protruding from the drain region into the notch and overlapping a first edge of the floating gate in a direction perpendicular to the substrate, an injection region having a first impurity type formed by said drain extension abutting said first edge of said floating gate is adapted to permit programming of the device through channel hot electron injection to said floating gate, and the drift region overlaps a sufficient portion of the floating gate such that a programming voltage for the device can be imparted to said floating gate through areal capacitive coupling.

4. The method of claim 3 wherein said drift region includes a notched shape.

5. The method of claim 3 wherein a coupling ratio is dependent on a size of said second portion of said drift region overlapping said floating gate.

6. The method of claim 3 wherein a polysilicon layer used for said floating gate is used for forming gates for high voltage transistor devices.

7. The method of claim 3 wherein the device shares structures and regions used by lateral high voltage devices in said high voltage circuit portion of the substrate.

8. The method of claim 3 further including a step: performing an implant for said drift region using a mask to impart a first shape for the device drift region that is different from a second shape imparted to a high voltage device in said high voltage circuit portion of the substrate.

9. The method of claim 8 further including a step: performing an implant for said source and drain a mask to impart a first shape for the device source and drain that is different from a second shape imparted to source and drain of a high voltage device in said high voltage circuit portion of the substrate.

10. The method of claim 3 wherein the device is formed with a thicker oxide than that used by logic devices in a portion separate from said high voltage circuit portion.

11. The method of claim 9 wherein the device is configured as a one-time programmable memory.

12. The method of claim 3 wherein the device is formed with a gate oxide that is the same as that used by high voltage devices in said high voltage circuit portion.

13. The method of claim 12 wherein the device is configured as a multiple time programmable memory.

14. A method of forming a programmable non-volatile memory device in a high voltage circuit portion of a substrate comprising;
   forming a floating gate on a surface of the high voltage circuit portion of a substrate;
   forming a source region in the high voltage circuit portion of a substrate;
   forming an N-type drain region in the high voltage circuit portion of a substrate;
   forming an N-type drift region with a notch extending into the drift region in a direction away from the source region, and such that a first portion of said N-type drift region overlaps part of said N-type drain region and a second portion of said N-type drift region overlaps part of said floating gate in a direction perpendicular to the substrate;
   wherein the drain region has an extension protruding from the drain region into the notch and overlapping a first edge of the floating gate in a direction perpendicular to the substrate, an injection region having a first impurity type formed by said drain extension abutting said first edge of said floating gate is adapted to permit programming of the device through channel hot electron injection to said floating gate, and said second portion of said N-type drift region overlaps a sufficient portion of the floating gate such that a programming voltage for the device can be imparted to said floating gate through areal capacitive coupling to said N-type drain region;
   further wherein the programmable non-volatile memory device as formed does not include or require a control gate to operate.

15. The method of claim 14 wherein the programmable non-volatile memory device is fabricated using only components also associated with a lateral extended drain NMOS device and/or a lateral double-diffused NMOS device.

16. The method of claim 1 wherein the programmable non-volatile memory device is a result of alterations to a high voltage device drift region mask and a high voltage source/drain mask.

17. The method of claim 1 wherein the drift region is C-shaped and said drain extension is formed from the notch.

18. The method of claim 1 wherein the programmable non-volatile memory device is fabricated using only components also associated with a lateral extended drain NMOS device and/or a lateral double-diffused NMOS device.

19. The method of claim 3 wherein said first impurity type is N-type.

20. The method of claim 3 wherein the programmable non-volatile memory device is a result of alterations to a high voltage device drift region mask and a high voltage source/drain mask.

\* \* \* \* \*